(12) United States Patent
Schultz

(10) Patent No.: US 7,268,292 B2
(45) Date of Patent: Sep. 11, 2007

(54) MULTI-DIMENSIONAL COMPLIANT THERMAL CAP FOR AN ELECTRONIC DEVICE

(75) Inventor: Mark D. Schultz, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 10/944,979

(22) Filed: Sep. 20, 2004

(65) Prior Publication Data

US 2006/0060367 A1 Mar. 23, 2006

(51) Int. Cl.
*H05K 5/00* (2006.01)
*H05K 7/20* (2006.01)

(52) U.S. Cl. .................. 174/17 VA; 174/520; 361/719; 361/704

(58) Field of Classification Search ........... 174/17 VA, 174/66, 187, 74 A, 93, 252, 50, 16.3, 54, 174/50.54, 520, 548, 547, 559, 17 CT, 17 R; 361/704, 719, 709, 715, 710, 720, 702, 676, 361/683, 687, 688, 703, 600, 601; 257/712, 257/713; 165/80.3, 185
See application file for complete search history.

(56) References Cited

U.S. PATENT DOCUMENTS

| 5,862,038 | A | * | 1/1999 | Suzuki et al. ............... 361/704 |
| 5,875,096 | A | * | 2/1999 | Gates ......................... 361/704 |
| 6,285,078 | B1 | * | 9/2001 | Nelson ........................ 257/712 |
| 6,870,246 | B1 | * | 3/2005 | Mullen et al. ............... 257/678 |
| 6,939,742 | B2 | * | 9/2005 | Bhatia et al. ................ 361/709 |

* cited by examiner

*Primary Examiner*—Angel R. Estrada
(74) *Attorney, Agent, or Firm*—Michael J. Buchenhorner; Casey P. August

(57) ABSTRACT

A cooling structure for an electronic device comprises a plate including a thermally conducting material disposed over the electronic device. The cooling structure includes a first support and a second support. One of the first support and the second support provides compliance in the x-y directions, and the other support provides compliance in the z direction. In another embodiment of the present invention, the plate comprises a material having high thermal conductivity.

11 Claims, 5 Drawing Sheets

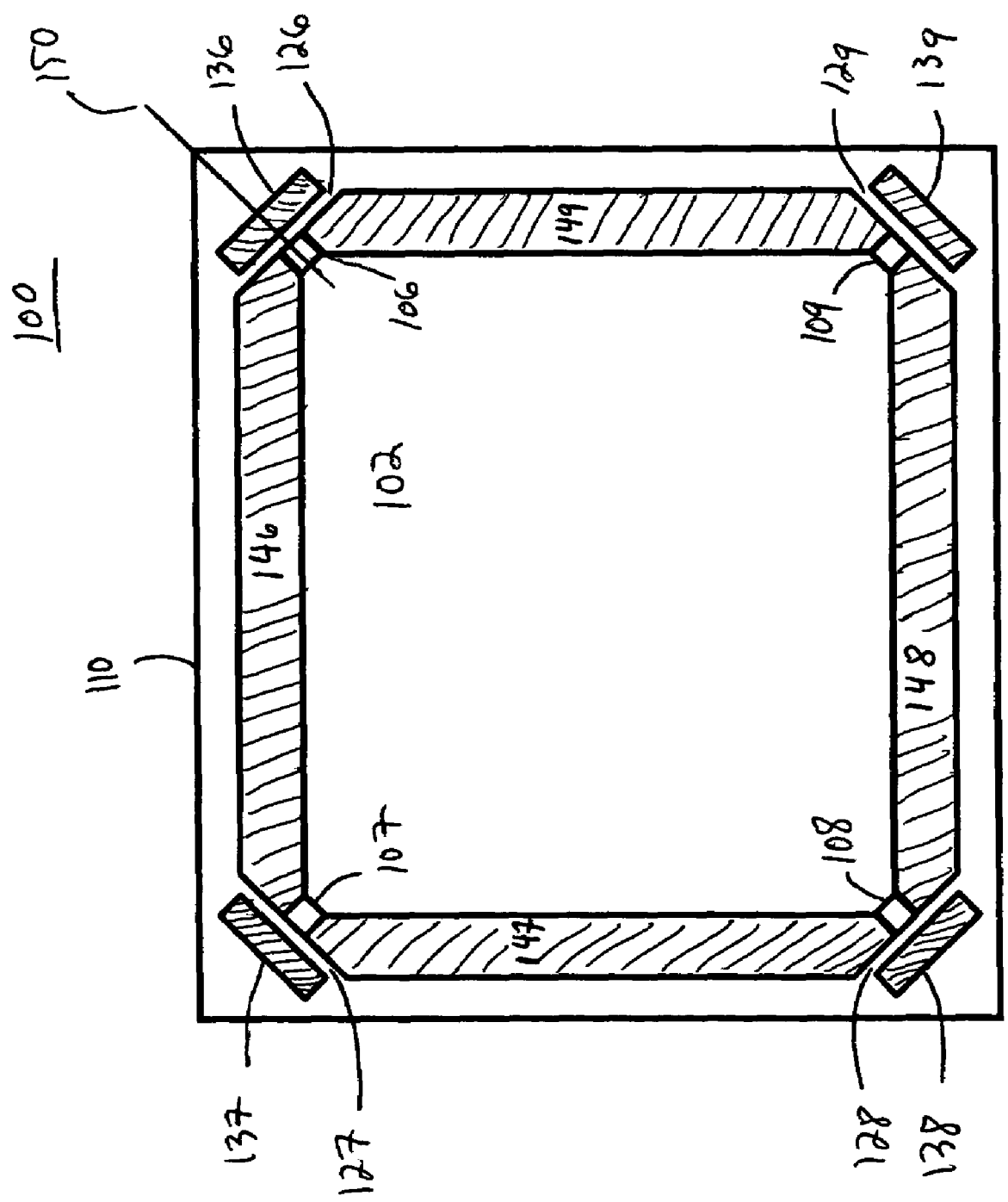

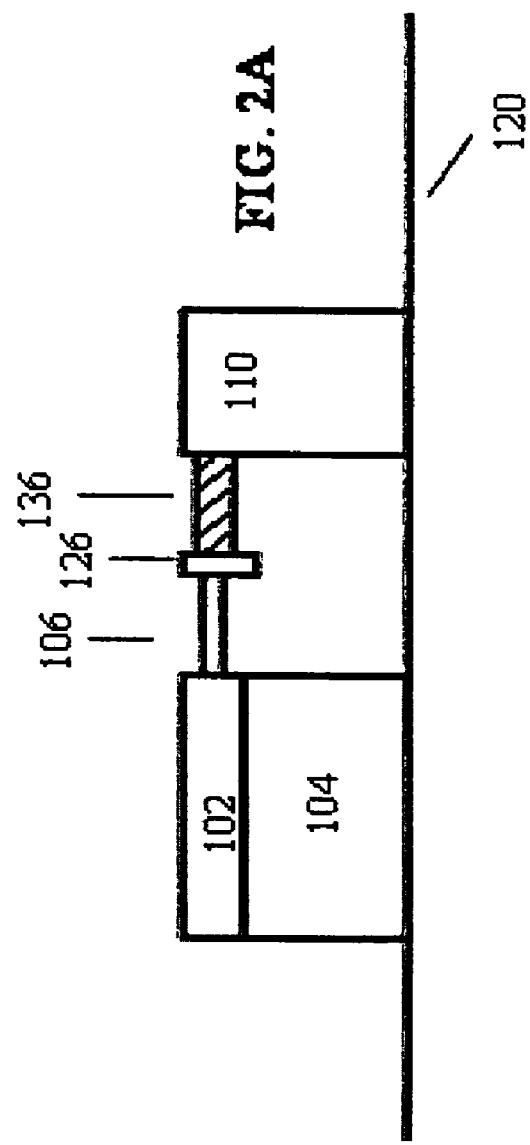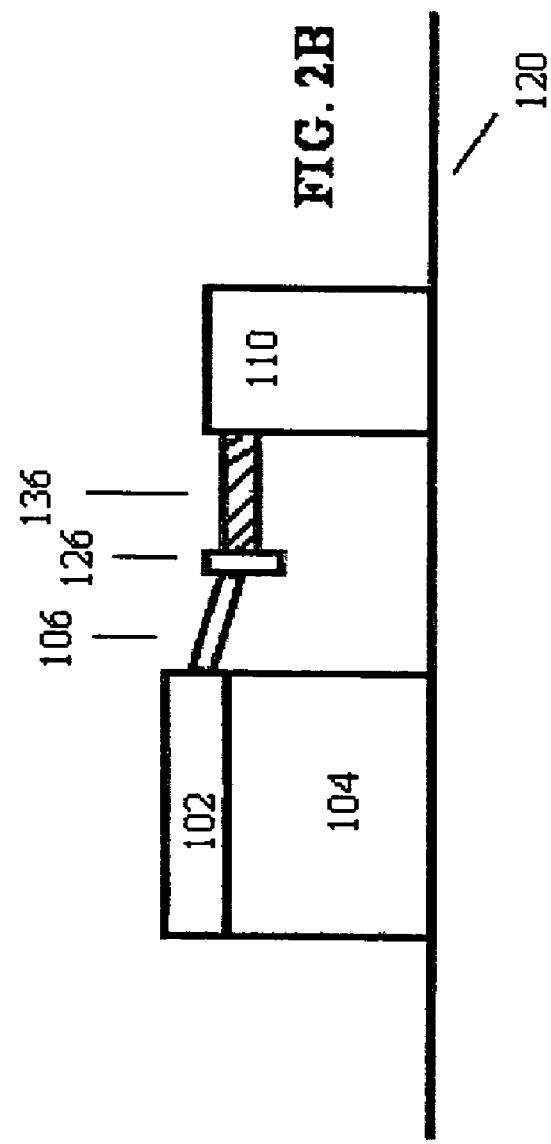

MULTI-DIMENSIONAL COMPLIANT THERMAL CAP FOR AN ELECTRONIC DEVICE

CROSS-REFERENCE TO RELATED APPLICATIONS

The present application is related to U.S. patent application Ser. No. 10/919,180, filed on Aug. 16, 2004 and entitled "Compliant Thermal Cap for Electronic Device." The aforementioned U.S. patent application is hereby incorporated by reference in its entirety.

STATEMENT REGARDING FEDERALLY SPONSORED-RESEARCH OR DEVELOPMENT

Not Applicable.

INCORPORATION BY REFERENCE OF MATERIAL SUBMITTED ON A COMPACT DISC

Not Applicable.

FIELD OF THE INVENTION

The invention disclosed broadly relates to the field of electronic devices and more particularly relates to the field of multi-dimensional compliant thermal caps for electronic devices.

BACKGROUND OF THE INVENTION

During the normal operation of a computer, integrated circuit devices generate significant amounts of heat. This heat must be continuously removed, or the integrated circuit device may overheat, resulting in damage to the device and/or a reduction in operating performance. Cooling devices, such as heat sinks, have been used in conjunction with integrated circuit devices in order to avoid such overheating. Generally, a passive heat sink in combination with a system fan has provided a relatively cost-effective cooling solution. In recent years, however, the power of integrated circuit devices has increased exponentially, resulting in a significant increase in the amount of heat generated by these devices, thereby making it extremely difficult to extract heat from these devices.

Heat is typically extracted by coupling a heat spreader and a thermal cap to the electronic device as a heat sink. Heat sinks operate by conducting heat from a processor to the heat sink and then radiating it into the air. The better the transfer of heat between the two surfaces (the processor and the heat sink metal) the better the cooling. Some processors come with heat sinks glued to them directly, or are interfaced through a thin and soft layer of thermal grease, ensuring a good transfer of heat between the processor and the heat sink. The thermal paste serves not only to transfer heat but to provide some degree of mechanical compliance to compensate for dimensional changes driven by the high operating temperatures of the devices. However, the paste is a weak link in the thermal path. Attempts to thin this layer have resulted in failure of the layer when it is exposed to dimensional changes. There are some known mechanically complaint solutions but these solutions still rely on paste film somewhere in the path. Thus there is a need for a solution that addresses these shortcomings.

SUMMARY OF THE INVENTION

Briefly, according to an embodiment of the invention, a cooling structure for an electronic device comprises a plate including a thermally conducting material disposed over the electronic device. The cooling structure includes a first support connected to the plate and a second support connected to the first support. One of the first support and the second support provides compliance in the x-y directions, and the other support provides compliance in the z direction. In another embodiment of the present invention, the plate comprises a material having high thermal conductivity.

In yet another embodiment of the present invention, a method for manufacturing a cooling structure for an electronic device comprises placing an electronic device on a substrate and producing a cooling structure disposed over the electronic device. The cooling structure includes a plate comprising a thermally conducting material, a first support connected to the plate and a second support connected to the first support, wherein one of the first support and the second support provides compliance in the x-y directions, and the other provides compliance in the z direction.

In yet another embodiment of the present invention, a cooling structure for a plurality of electronic devices comprises a plate for each of the plurality of electronic devices, each plate comprising a thermally conducting material disposed over the corresponding electronic device. The cooling structure further comprises a first support connected to each of the plates and a second support connected to each of the first supports. One of the first supports and the second supports provide compliance in the x-y directions, and the other provides compliance in the z direction.

BRIEF DESCRIPTION OF THE DRAWINGS

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings. Additionally, the left-most digit of a reference number identifies the drawing in which the reference number first appears.

FIG. 1 shows a top view of a multi-dimensional compliant thermal cap disposed over an electronic device, according to an embodiment of the invention.

FIG. 2A shows a side cross-section of a portion of the multi-dimensional compliant thermal cap 100 of FIG. 1.

FIG. 2B shows another side cross-section of a portion of the multi-dimensional compliant thermal cap of FIG. 1, as it adapts to dimensional changes of the electronic device and surrounding structures.

DETAILED DESCRIPTION

Figure 3:
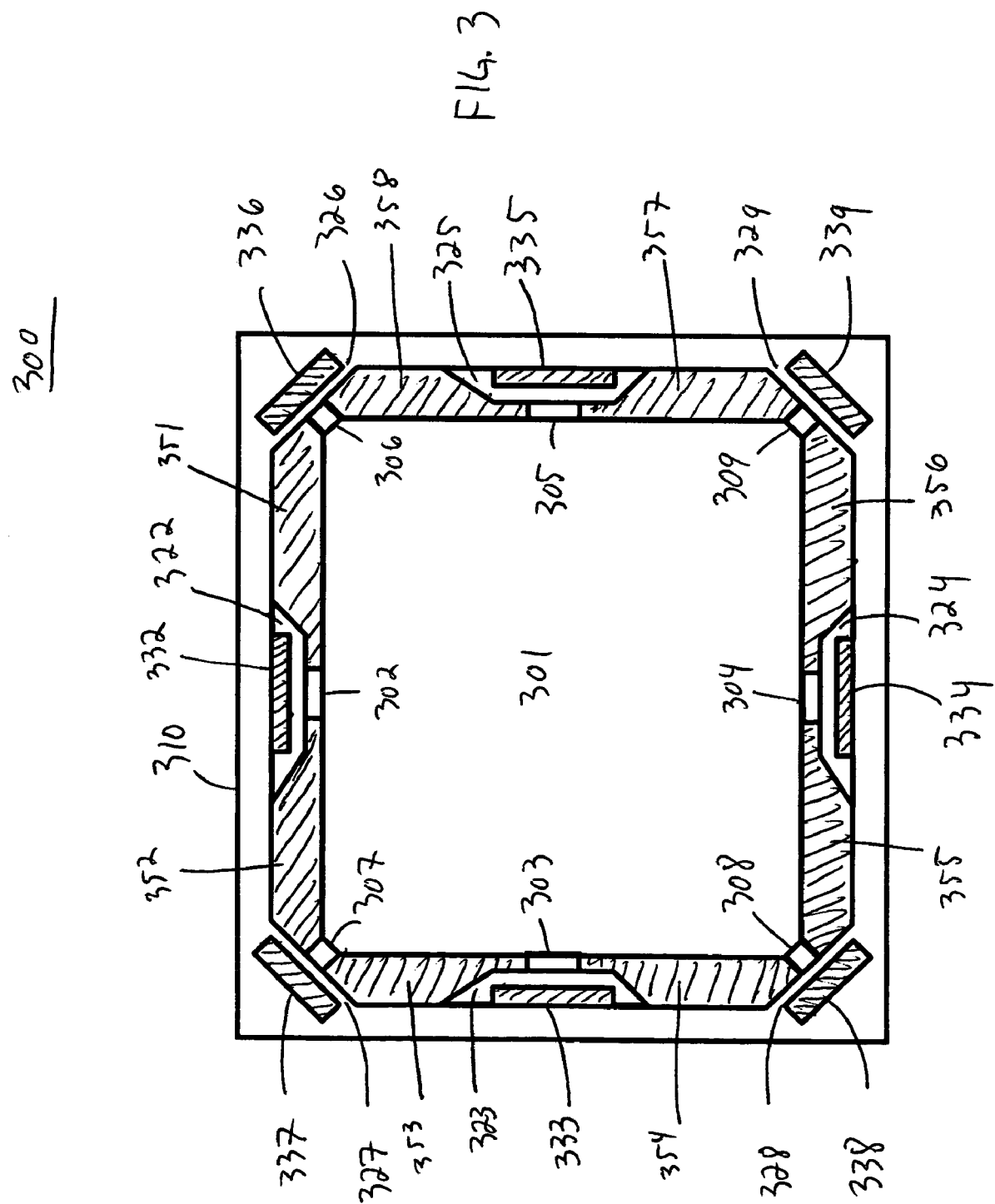
FIG. 3 shows a top view of an alternative multi-dimensional compliant thermal cap, in one embodiment of the present invention.

FIG. 1 shows a top view of a multi-dimensional compliant thermal cap 100 disposed over an electronic device 104, according to an embodiment of the invention. A compliant thermal cap 100 comprises a moveable top plate 102 for providing the resilience required to overcome the problems of the prior art. The top plate 102 comprises a flat rectangular plate that covers the top surface area of the electronic device (e.g., a semiconductor chip) that is not shown. Note that while a flat plate is preferred, the plate may include a structure, such as heat sink fins, on the side opposing the electronic device. A main housing 110 encircles and is coupled with the top plate 102. The main housing 110 extends downward and is placed on a substrate or an electronic circuit board.

The top plate 102 is attached to at least one movable connector 106 that allows movement of the top plate 102 in the z-directions, or upwards and downwards. In an embodiment of the present invention, the top plate 102 can be connected to additional movable connectors, such as connectors 107, 108 and 109, located in each corner of the top plate 102. The movable connector 106 is further connected to a movable bar 126 that allows movement in the x-y direction, or sideways. Thus, one end of the movable connector 106 is coupled with the top plate 102 and the other end of the movable connector 106 is coupled with the movable bar 126. Note that the movable bar 126 is integrated with the main housing 110 and the movable bar 126 is formed from the establishment of a slot orifice 136. That is, the fabrication of the slot orifice 136 creates the movable bar 126 as an integrated element of main housing 110. In an embodiment of the present invention, additional movable connectors 107, 108 and 109 are connected to additional movable bars 127, 128 and 129, respectively, also allowing movement in the x-y direction. Note that movable connectors 127, 128 and 129 are integrated with the main housing 110 and each movable connector is formed from the establishment of slot orifices 137, 138 and 139, respectively.

Each movable bar 126-129 comprises a thin bar-like structure that can bend or otherwise change shape so as to allow the body of the movable bar to move towards and away from the top plate 102. This bending or morphing action is a result of the spring-like structure of the movable bars. This allows movement of the top plate 102 in the x-y direction, since the top plate 102 is connected to the movable bar 126 or movable bars 126-129.

FIG. 1 also shows orifices 146, 147, 148 and 149. These orifices represent a gap between the top plate 102 and the main housing 110. The orifices 146-149 allow for the movement of the top plate 102 in any direction, including the x-direction and the x-y direction. In an embodiment of the present invention, the orifices 146-149, as well as orifices 136-139, are filled with low-modulus seal material such as silicone. The seal material fills each orifice and allows for stretch and movement in multiple directions such that the thermal compliant cap 100 is compliant with thermal expansion and compression of the electronic device. The seal material can be used to seal the electronic device such that it is environmentally separated from the outside. This can be beneficial in situations where the electronic device can react adversely to air, certain gases, liquids or other environmental hazards.

The compliant thermal cap 100 serves the function of dissipating heat generated by the electronic device and conforms to thermal expansion of the device caused by the difference in the coefficients of thermal expansions of the materials of the device and the top plate 102 of the thermal compliant cap 100 as well as thermally induced dimensional changes in the substrate structure underlying the electronic device. Due to the movable nature of the connectors 106-109 and the bars 126-129, the complaint thermal cap 100 exhibits compliance in multiple directions, specifically, the "z" direction, as well as the "x-y" directions, i.e., the up, down and sideways directions. Line 150 indicates the plane through which the cross section view of FIG. 2 is taken.

FIG. 2A shows a side cross-section of a portion of the multi-dimensional compliant thermal cap 100 of FIG. 1. FIG. 2A shows the thermal compliant cap 100 and the device 104 in a rest state exhibiting no stress or thermal expansion. The top plate 102 comprises a flat rectangular plate that covers the top surface area of the electronic device 104 (e.g., a semiconductor chip). A main housing 110 encompasses the device 104 and extends downward and is placed on a substrate 120 or an electronic circuit board. FIG. 2A shows the top plate 102 attached to the movable bar 126 via the connector 106. Orifice 136 separates the movable bar 126 from the remaining portions of the main housing 110. In an embodiment of the present invention, a low modulus seal material fills the orifice 136 to provide a seal over the gap.

FIG. 2B shows another side cross-section of a portion of the multi-dimensional compliant thermal cap of FIG. 1, as it adapts to dimensional changes of the electronic device. FIG. 2B shows that the top plate 102 at a greater elevation than the top plate of FIG. 2A. FIG. 2B shows that the electronic device 104 has also increased in vertical size. The increase in vertical size of the electronic device 104 is due to the thermal expansion of the electronic device 104, resulting in the increase in elevation of the top plate 102, which rests on the electronic device 104.

Note that the movable connector 106 has bent to allow the top plate 102 to elevate itself to accommodate the increased size of the electronic device 104. The movable connector 106 allows for the first end of the movable connector 106 to maintain its connection with the top plate 102 and the second end to maintain its connection with the main housing 110 while allowing for movement in the z-direction direction of the top plate 102. This allows the thermal compliant cap 100 to be compliant with thermal expansion and compression of the electronic device 104.

Also note that the gap 136 has grown in size to accommodate the shift in the x-y direction of the electronic device 104. As a result, movable bar 126 has bent or otherwise morphed to accommodate the increase in the size of the orifice 136. The orifice 136 and the movable bar 126 allow for movement in the x-y direction of the top plate 102. This allows the thermal compliant cap 100 to be compliant with thermal expansion and compression of the electronic device 104 in an additional direction.

In an embodiment where the orifice 136 includes a low modulus seal material, the material would stretch to cover the elongated gap 136 to accommodate the increase in the size of the orifice 136. This would serve to further the purpose of the seal material, which is to seal the electronic device such that it is environmentally separated from the outside. Further, the seal material allows for stretch and movement in multiple directions such that the thermal compliant cap 100 is compliant with thermal expansion and compression of the electronic device.

In an embodiment of the present invention, the electronic device 104 is attached to the top plate 102 via a coupling element comprising a thermal paste or other adhesive (not shown). The coupling element may also include a heat spreader that allows the heat emanating form the electronic device 104 to spread and be transferred to the top plate 102 for dissipation.

FIG. 3 shows a top view of an alternative multi-dimensional compliant thermal cap 310, in one embodiment of the present invention. The thermal compliant cap 310 includes the equivalent structures of the thermal compliant cap 110, with the addition of supplementary movable connectors, movable bars and orifices in the main housing.

The compliant thermal cap 310 comprises a top plate 301 similar to top plate 102, comprising a flat rectangular plate that covers the top surface area of the electronic device that is not shown. A main housing 310 encircles and is coupled with the top plate 301. The main housing 110 extends downward and is placed on a substrate or an electronic circuit board.

The top plate 301 is attached to at least one movable connectors 302, 303, 304, 305, 306, 307, 308 and 309 that allow movement of the top plate 301 in the z-directions, or upwards and downwards. The movable connectors 302-309 are further connected to movable bars 322, 323, 324, 325, 326, 327, 328 and 329, respectively, that allow movement in the x-y direction, or sideways. Note that the movable bars 322-329 are integrated with the main housing 310 and the movable bars are formed from the establishment of slot orifices 332, 333, 334, 335, 336, 337, 338 and 339, respectively. That is, the fabrication of the slot orifices 332-339 create the movable bars 322-329 as an integrated element of main housing 310.

FIG. 3 also shows orifices 351-358. These orifices represent a gap between the top plate 301 and the main housing 310. The orifices 351-358 allow for the movement of the top plate 301 in any direction, including the x-direction and the x-y direction. In an embodiment of the present invention, the orifices 351-358, as well as slot orifices 332-339, are filled with low-modulus seal material such as silicone. The seal material fills each orifice and allows for stretch and movement in multiple directions such that the thermal compliant cap 300 is compliant with thermal expansion and compression of the electronic device.

The compliant thermal cap 300 serves the function of dissipating heat generated by the electronic device and conforms to thermal expansion of the device caused by the difference in the coefficients of thermal expansions of the materials of the device and the top plate 301 of the thermal compliant cap 300. Due to the movable nature of the connectors 302-309 and the bars 322-329, the complaint thermal cap 300 exhibits compliance in multiple directions, specifically, the "z" direction, as well as the "x-y' directions, i.e., the up, down and sideways directions.

In an embodiment of the present invention, the thermal cap 300 (or thermal cap 100) is machined from a single element of a thermally conducting material, such as copper. The single element of thermally conducting material initially is machined, or drilled or cut, to include the features of present invention. In this embodiment, the top plate 301, as well as movable connectors 302, 303, 304, 305, 306, 307, 308 and 309 are created through the machining, or cutting, of orifices 351-358. Further, the movable bars 322, 323, 324, 325, 326, 327, 328 and 329, are created through the machining, or cutting, of slot orifices 332, 333, 334, 335, 336, 337, 338 and 339, respectively. That is, the fabrication of the slot orifices 332-339 create the movable bars 322-329 as an integrated element of main housing 310.

Figure 4:
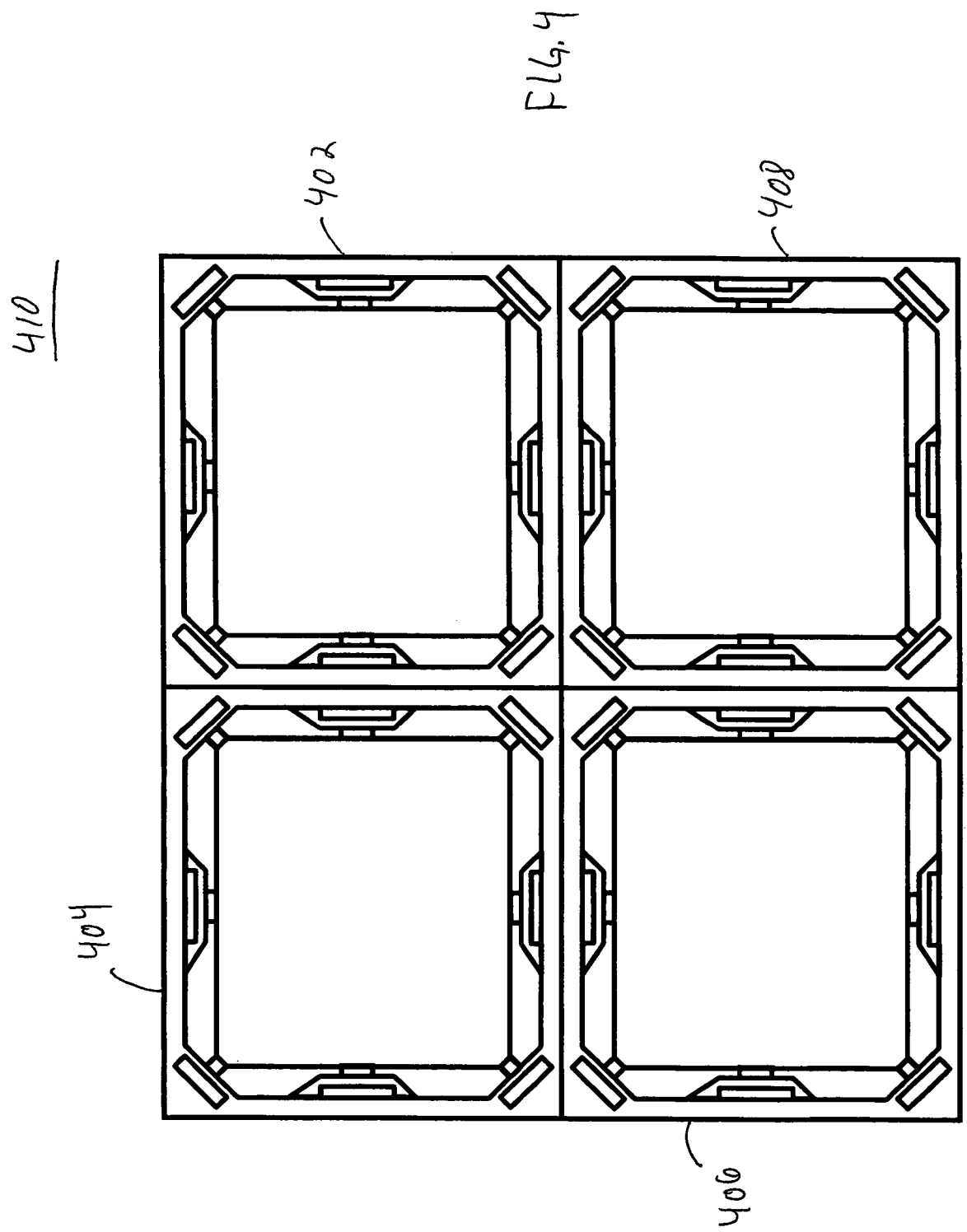
FIG. 4 shows a top view of an alternative multi-processor multi-dimensional compliant thermal cap, in one embodiment of the present invention.

FIG. 4 shows a top view of an alternative multi-processor multi-dimensional compliant thermal cap 410, in one embodiment of the present invention. The thermal compliant cap 410 includes the equivalent of four cooling structures, as described in FIG. 3, aggregated to form one cooling structure that offers cooling and compliant functionalities to four separate electronic devices (not shown). Each quadrant of FIG. 4 (402, 404, 406 and 408) includes a cooling structure 500 and its corresponding components, as described with reference to FIG. 3 below.

Figure 5:
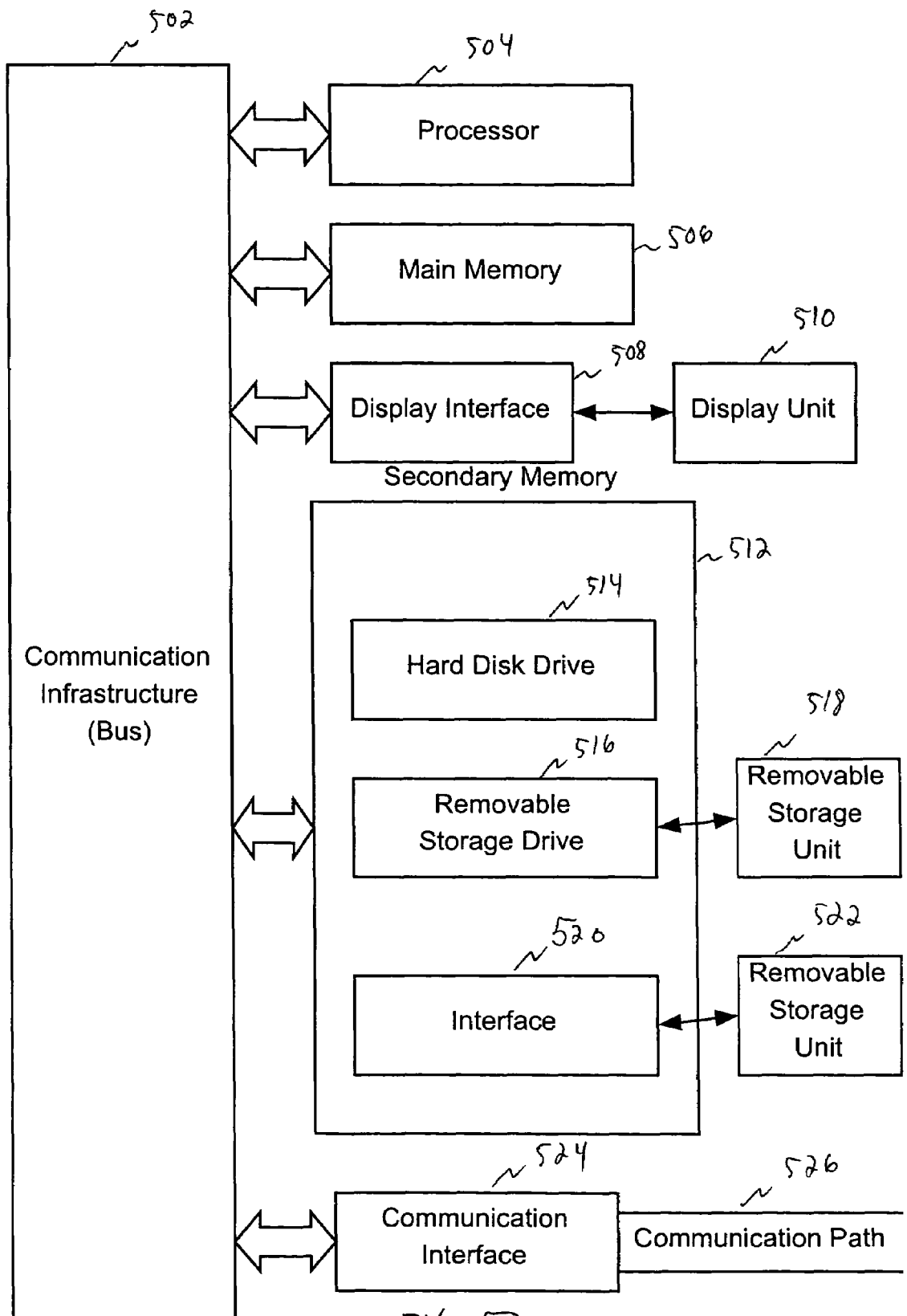
FIG. 5 is a high level block diagram showing an information processing system useful for implementing one embodiment of the present invention.

The present invention can be utilized for cooling any of a variety of electronic devices. In one embodiment of the present invention, the present invention is used to cool a microprocessor of an information processing system such as a computer. FIG. 5 is a high level block diagram showing an information processing system useful for implementing one embodiment of the present invention. The computer system includes one or more processors, such as processor 504. The processor 504 is connected to a communication infrastructure 502 (e.g., a communications bus, cross-over bar, or network). Various software embodiments are described in terms of this exemplary computer system. After reading this description, it will become apparent to a person of ordinary skill in the relevant art(s) how to implement the invention using other computer systems and/or computer architectures.

The computer system can include a display interface 508 that forwards graphics, text, and other data from the communication infrastructure 502 (or from a frame buffer not shown) for display on the display unit 510. The computer system also includes a main memory 506, preferably random access memory (RAM), and may also include a secondary memory 512. The secondary memory 512 may include, for example, a hard disk drive 514 and/or a removable storage drive 516, representing a floppy disk drive, a magnetic tape drive, an optical disk drive, etc. The removable storage drive 516 reads from and/or writes to a removable storage unit 518 in a manner well known to those having ordinary skill in the art. Removable storage unit 518, represents a floppy disk, a compact disc, magnetic tape, optical disk, etc. which is read by and written to by removable storage drive 516. As will be appreciated, the removable storage unit 518 includes a computer readable medium having stored therein computer software and/or data.

In alternative embodiments, the secondary memory 512 may include other similar means for allowing computer programs or other instructions to be loaded into the computer system. Such means may include, for example, a removable storage unit 522 and an interface 520. Examples of such may include a program cartridge and cartridge interface (such as that found in video game devices), a removable memory chip (such as an EPROM, or PROM) and associated socket, and other removable storage units 522 and interfaces 520 which allow software and data to be transferred from the removable storage unit 522 to the computer system.

The computer system may also include a communications interface 524. Communications interface 524 allows software and data to be transferred between the computer system and external devices. Examples of communications interface 524 may include a modem, a network interface (such as an Ethernet card), a communications port, a PCM-CIA slot and card, etc. Software and data transferred via communications interface 524 are in the form of signals which may be, for example, electronic, electromagnetic, optical, or other signals capable of being received by communications interface 524. These signals are provided to communications interface 524 via a communications path (i.e., channel) 526. This channel 526 carries signals and may be implemented using wire or cable, fiber optics, a phone line, a cellular phone link, an RF link, and/or other communications channels.

In this document, the terms "computer program medium," "computer usable medium," and "computer readable medium" are used to generally refer to media such as main memory 506 and secondary memory 512, removable storage drive 516, a hard disk installed in hard disk drive 514, and signals. These computer program products are means for providing software to the computer system. The computer readable medium allows the computer system to read data, instructions, messages or message packets, and other computer readable information from the computer readable medium.

Computer programs (also called computer control logic) are stored in main memory 506 and/or secondary memory 512. Computer programs may also be received via communications interface 524. Such computer programs, when executed, enable the computer system to perform the features of the present invention as discussed herein. In particular, the computer programs, when executed, enable the processor 504 to perform the features of the computer system. Accordingly, such computer programs represent controllers of the computer system.

What has been shown and discussed is a highly-simplified depiction of a programmable computer apparatus. Those skilled in the art will appreciate that other low-level components and connections are required in any practical application of a computer apparatus.

Therefore, while there has been described what is presently considered to be the preferred embodiment, it will be understood by those skilled in the art that other modifications can be made within the spirit of the invention.

What is claimed is:

1. A cooling structure for cooling an electronic device, the cooling structure comprising:
   a compliant thermal cap disposed over the electronic device, the thermal cap comprising:
      a moveable top plate attached to at least one moveable connector for allowing movement of the top plate in the z-direction; wherein the at least one moveable connector is further connected to at least one moveable vertical support allowing movement in the x-y directions; wherein each moveable vertical support comprises a thin bar-like compliant structure such that the moveable vertical support moves towards and away from the top plate;
   a thermally conducting material disposed over the electronic device;
   a main housing encircling and coupled with the top plate; and
   a plurality of gaps between the top plate and the main housing.

2. The cooling structure of claim 1, wherein the moveable connectors are positioned at each corner of the top plate.

3. The cooling structure of claim 1, wherein the moveable vertical supports comprise a thin bar-like structure that can bend or otherwise change shape.

4. The cooling structure of claim 3, further comprising:
   a low-modulus seal material disposed over each gap.

5. The cooling structure of claim 3, further comprising:
   a seal material disposed between the top plate and the moveable vertical support.

6. The cooling structure of claim 1, wherein the electronic device is placed on a substrate and the cooling structure further comprises fasteners through the substrate.

7. The cooling structure of claim 1, further comprising:
   a coupling element disposed between the electronic device and the plate.

8. The cooling structure of claim 1, further comprising:
   thermal paste applied between the electronic device and the plate.

9. The cooling structure of claim 8, further comprising:
   a spreader located over the electronic device and coupled with the plate.

10. A cooling structure for a plurality of electronic devices, comprising:
    a plate for each of the plurality of electronic devices, each plate comprising a thermally conducting material disposed over the corresponding electronic device;
    a first support connected to each of the plates; and
    a second support connected to each of the first supports, wherein one of the first supports and the second supports provide compliance in the x-y directions, and the other provides compliance in the z direction.

11. The cooling structure of claim 10, further comprising:
    a vertical support connected to each of the second supports, wherein the vertical supports hold the first supports, the second supports and the plates over the plurality of electronic devices.

* * * * *